United States Patent
Lu et al.

(10) Patent No.: US 10,520,823 B2
(45) Date of Patent: *Dec. 31, 2019

(54) EUV LITHOGRAPHY SYSTEM AND METHOD WITH OPTIMIZED THROUGHPUT AND STABILITY

(71) Applicant: Taiwan Semiconductor Manufacturing Company, Ltd., Hsin-Chu (TW)

(72) Inventors: Yen-Cheng Lu, New Taipei (TW); Jeng-Horng Chen, Hsin-Chu (TW); Shun-Der Wu, Tainan (TW); Anthony Yen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/219,561

(22) Filed: Dec. 13, 2018

(65) Prior Publication Data
US 2019/0121241 A1  Apr. 25, 2019

Related U.S. Application Data

(63) Continuation of application No. 15/617,882, filed on Jun. 8, 2017, now Pat. No. 10,156,790, which is a continuation of application No. 14/717,890, filed on May 20, 2015, now Pat. No. 9,678,431.

(60) Provisional application No. 62/133,882, filed on Mar. 16, 2015.

(51) Int. Cl.
*G03F 7/20* (2006.01)

(52) U.S. Cl.
CPC ...... *G03F 7/70033* (2013.01); *G03F 7/70558* (2013.01)

(58) Field of Classification Search
CPC .................................................. G03F 7/70033
See application file for complete search history.

(56) References Cited

U.S. PATENT DOCUMENTS

| 8,628,897 | B1 | 1/2014 | Lu et al. |
| 8,679,707 | B2 | 3/2014 | Lee et al. |
| 8,691,476 | B2 | 4/2014 | Yu et al. |

(Continued)

FOREIGN PATENT DOCUMENTS

| CN | 103038669 A | 4/2013 |
| DE | 10251435 B3 | 5/2004 |

(Continued)

*Primary Examiner* — Steven Whitesell Gordon
(74) *Attorney, Agent, or Firm* — Haynes and Boone, LLP

(57) ABSTRACT

Lithography methods and corresponding lithography apparatuses are disclosed herein for improving throughput of lithography exposure processes. An exemplary lithography method includes generating a plurality of target material droplets and generating radiation from the plurality of target material droplets based on a dose margin to expose a wafer. The dose margin indicates how many of the plurality of target material droplets are reserved for dose control. In some implementations, the plurality of target material droplets are grouped into a plurality of bursts, and the lithography method further includes performing an inter-compensation operation that designates an excitation state of target material droplets in one of the plurality of bursts to compensate for an energy characteristic of another one of the plurality of bursts.

20 Claims, 10 Drawing Sheets

(56) References Cited

U.S. PATENT DOCUMENTS

| | | |
|---|---|---|
| 8,709,682 B2 | 4/2014 | Chen et al. |
| 8,715,890 B2 | 5/2014 | Tu et al. |
| 8,722,286 B2 | 5/2014 | Yu et al. |
| 8,753,788 B1 | 6/2014 | Yu et al. |
| 8,764,995 B2 | 7/2014 | Chang et al. |
| 8,765,330 B2 | 7/2014 | Shih et al. |
| 8,765,582 B2 | 7/2014 | Hsu et al. |
| 8,785,084 B2 | 7/2014 | Lu et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,678,431 B2 | 6/2017 | Lu et al. |
| 2003/0223542 A1 | 12/2003 | Shields |
| 2012/0286176 A1 | 11/2012 | Rajyaurul et al. |
| 2013/0022901 A1 | 1/2013 | Buuman et al. |
| 2013/0077073 A1 | 3/2013 | Van Schoot et al. |
| 2013/0209077 A1 | 8/2013 | Yabu |
| 2013/0320232 A1 | 12/2013 | Hori |
| 2014/0091239 A1 | 4/2014 | van der Burgt et al. |
| 2014/0191132 A1 | 7/2014 | Schafgans et al. |
| 2014/0191133 A1 | 7/2014 | Crouch |
| 2014/0253716 A1 | 9/2014 | Saito |
| 2014/0333915 A1 | 11/2014 | Hoogkamp et al. |

FOREIGN PATENT DOCUMENTS

| | | |
|---|---|---|
| EP | 1617292 B1 | 12/2010 |
| TW | 201433216 A | 8/2014 |
| WO | 2013083335 A2 | 6/2013 |

Probability Density of Function $$B_a(x) = \frac{1}{\sqrt{2\pi}\,\sigma_a} \exp\left(-\frac{(x-\mu_a)^2}{2\sigma_a^2}\right) \quad \leftarrow 62$$

$$B_b(x) = \frac{1}{\sqrt{2\pi}\,\sigma_b} \exp\left(-\frac{(x-\mu_b)^2}{2\sigma_b^2}\right) \quad \leftarrow 64$$

$$B_{a+b}(x) = \int_{-\infty}^{\infty} B_a(s) \times B_b(x-s)\,ds = B_a(x) \otimes B_b(x)$$

$$= \frac{1}{\sqrt{2\pi(\sigma_a^2+\sigma_b^2)}} \exp\left(-\frac{[x-(\mu_a+\mu_b)]^2}{2(\sigma_a^2+\sigma_b^2)}\right) \quad \leftarrow 66$$

N identical Burst $$B_N(x) = \frac{1}{\sqrt{2N\pi}\,\sigma} \exp\left(-\frac{(x-N\mu)^2}{2(\sqrt{N}\sigma)^2}\right) \quad \leftarrow 68$$

$$\text{Dose Error} \propto \frac{1}{\sqrt{N}} \quad \leftarrow 70$$

Fig. 5

| PR Dose | Dose Margin Needed | Target Energy |
|---|---|---|
| 15 | 30% | 10.5 |
| 20 | 25% | 11.25 |
| 25 | 20% | 12 |
| 30 | 15% | 12.75 |
| 35 | 10% | 13.5 |
| 40 | 8% | 13.8 |

Fig. 8

EUV LITHOGRAPHY SYSTEM AND METHOD WITH OPTIMIZED THROUGHPUT AND STABILITY

This is a continuation application of U.S. patent application Ser. No. 15/617,882, filed Jun. 8, 2017, now U.S. Pat. No. 10,156,790, which is a continuation of U.S. patent application Ser. No. 14/717,890, filed May 20, 2015, now U.S. Pat. No. 9,678,431, which claims the benefit of U.S. Provisional Patent Application Ser. No. 62/133,882, filed Mar. 16, 2015, each of which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). The EUVL employs scanners using light in the extreme ultraviolet (EUV) region, having a wavelength of about 1-100 nm. EUV scanners use reflective rather than refractive optics, i.e., mirrors instead of lenses.

Therefore, while existing lithography techniques have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 illustrates various formulas and calculations used to analyze the dose margin, constructed in accordance with some embodiments.

FIG. 8 illustrates a dose margin lookup table used in the method of FIG. 7, constructed in accordance with some embodiments.

DETAILED DESCRIPTION

Figure 1:
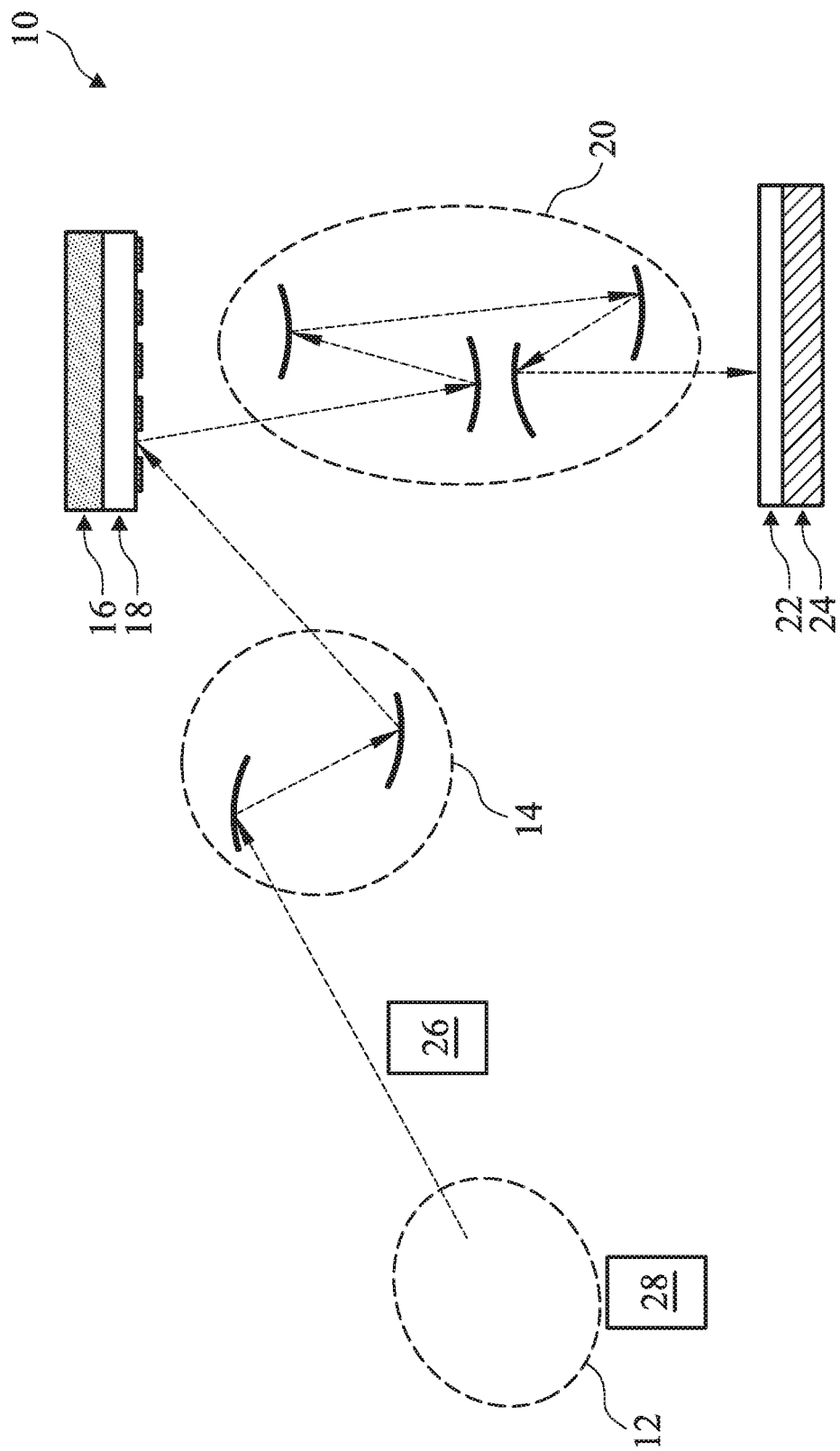
FIG. 1 is a schematic view of an EUV lithography system with a laser produced plasma (LPP) EUV radiation source, constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The apparatus may be otherwise oriented (rotated 90 degrees or at other orientations) and the spatially relative descriptors used herein may likewise be interpreted accordingly.

FIG. 1 is a schematic view diagram of a lithography system 10, constructed in accordance with some embodiments. The lithography system 10 may also be generically referred to as a scanner that is operable to perform lithography exposing processes with respective radiation source and exposure mode. In the present embodiment, the lithography system 10 is an extreme ultraviolet (EUV) lithography system designed to expose a resist layer by EUV light. The resist layer is a suitable material sensitive to the EUV light. The EUV lithography system 10 employs a radiation source 12 to generate EUV light, such as EUV light having a wavelength ranging between about 1 nm and about 100 nm. In one particular example, the radiation source 12 generates an EUV light with a wavelength centered at about 13.5 nm. Accordingly, the radiation source 12 is also referred to as EUV radiation source 12. In the present embodiment, the EUV radiation source 12 utilizes a mechanism of laser-produced plasma (LPP) to generate the EUV radiation, which will be further described later.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the radiation source 12 onto a mask stage 16. In the present embodiment where the radiation source 12 generates light in the EUV wavelength range, reflective optics is employed.

The lithography system 10 includes the mask stage 16 configured to secure a mask 18. In some embodiments, the mask stage 16 includes an electrostatic chuck (e-chuck) to secure the mask 18. This is because that gas molecules absorb EUV light and the lithography system for the EUV lithography patterning is maintained in a vacuum environment to avoid the EUV intensity loss. In the disclosure, the terms of mask, photomask, and reticle are used to refer to the same item. In the present embodiment, the lithography system 10 is an EUV lithography system, and the mask 18 is a reflective mask. One exemplary structure of the mask 18 is provided for illustration. The mask 18 includes a substrate with a suitable material, such as a low thermal expansion material (LTEM) or fused quartz. In various examples, the LTEM includes $TiO_2$ doped $SiO_2$, or other suitable materials with low thermal expansion. The mask 18 includes a reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask 18 may further include a capping layer, such as ruthenium (Ru), disposed on the ML for protection. The mask 18 further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The lithography system 10 also includes a projection optics module (or projection optics box (POB) 20 for imaging the pattern of the mask 18 on to a semiconductor substrate 22 secured on a substrate stage 24 of the lithography system 10. In the present embodiment, the POB 20 has reflective optics for projecting the EUV light. The EUV light, which carries the image of the pattern defined on the mask, is directed from the mask 18 and is collected by the POB 20. The illuminator 14 and the POB 20 are collectively referred to an optical module of the lithography system 10.

The lithography system 10 also includes the substrate stage 24 to secure the semiconductor substrate 22. In the present embodiment, the semiconductor substrate 22 is a semiconductor wafer, such as a silicon wafer or other type of wafer to be patterned. The semiconductor substrate 22 is coated with the resist layer sensitive to the radiation beam, such as EUV light in the present embodiment. Various components including those described above are integrated together and are operable to perform lithography exposing processes.

In some embodiments, the lithography system 10 includes an EUV energy monitor 26 designed to monitor the EUV intensity or energy from the EUV radiation source 12. For example, the EUV energy monitor 26 includes an EUV sensing element, such as a diode, designed to be sensitive to the EUV light and configured to effectively detect the EUV light. In other examples, the EUV energy monitor 26 includes a plurality of diodes configured in an array to effectively detect the EUV light for monitoring purpose.

In some embodiments, the lithography system 10 includes a plasma monitoring module 28 to monitor plasma stability of the radiation source 12. The plasma condition of the radiation source 12 varies over time. For example, a target material is used to generate plasma and the condition of the target material changes over time, such as droplet size, the ionized rate from the target material changes, and the plasma concentration changes accordingly. The variation of plasma condition also causes the variation of the EUV intensity in the lithography exposing process. In some examples, the plasma monitoring module 28 includes a mechanism to monitor the utilization of the target material droplets in the dose margin. The plasma monitoring module 28 tracks the historic data of the utilization of the target material droplets for the semiconductor wafers previously processed in the lithography system 10. The plasma monitoring module 28 is integrated with the radiation source 12. In some examples, the plasma monitoring module 28 is embedded in the radiation source 12. The dose margin and other terms will be further described at later stage.

In some other embodiments, the function of the plasma monitoring module 28 may be implemented by the EUV energy monitor 26. For example, the dose error is related to the plasma instability, through monitoring the EUV energy by the EUV energy monitor 26, the dose error is extracted from the monitored EUV energy. In this case, the plasma monitoring module 28 is eliminated or combined with the EUV energy monitor 26.

The lithography system 10 may further include other modules or be integrated with (or be coupled with) other modules. In some embodiments, the lithography system 10 includes a database to maintain a dose margin lookup table and historic fabrication data. In some embodiments, the lithography system 10 includes a dose margin extraction module to provide a dose margin to a lithography exposing process applied to the wafer 22. In furtherance of the embodiments, the dose margin is determined according to the dose margin lookup table. In some embodiments, the lithography system 10 includes a lookup table maintaining module designed to maintain the dose margin lookup table. In furtherance of the embodiments, the lookup table maintaining module is coupled with the database and the plasma monitoring module. The lookup table maintaining module updates the dose margin lookup table according to the dose margin variation from the plasma monitoring module.

In some embodiments, the lithography system 10 includes a gas supply module designed to provide hydrogen gas to the radiation source 12, which effectively protects radiation source 12 (such as the collector) from the contaminations. In other embodiments, the lithography system 10 includes magnet configured to guide the plasma by the corresponding magnetic field.

Figure 2:
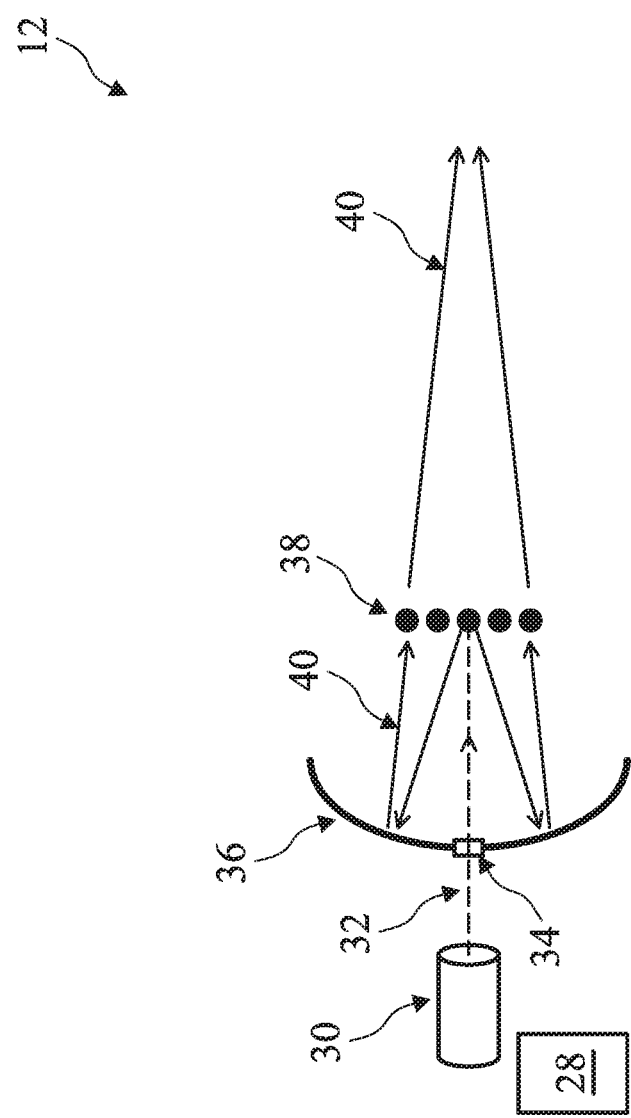
FIG. 2 is a diagrammatic view of the EUV radiation source in the EUV lithography system of FIG. 1, constructed in accordance with some embodiments.

Particularly, the radiation source 12 is further illustrated in FIG. 2 in a diagrammatical view, constructed in accordance with some embodiments. The radiation source 12 employs a laser produced plasma (LPP) mechanism to generate plasma and further generate EUV light from the plasma. The radiation source 12 includes a laser 30, such as pulse carbon dioxide ($CO_2$) laser to generate a laser beam 32. The laser beam is directed through an output window 34 integrated with a collector (also referred to as LPP collector or EUV collector) 36. The output window 34 adopts a suitable material substantially transparent to the laser beam. The collector 36 is designed with proper coating materials and shape, functioning as a mirror for EUV collection, reflection and focus. In some embodiments, the collector 36 is designed to have an ellipsoidal geometry. In some embodiments, the coating material of the collector 36 is similar to the reflective multilayer of the EUV mask 18. In some examples, the coating material of the collector 36 includes a ML (such as a plurality of Mo/Si film pairs) and may further include a capping layer (such as Ru) coated on the ML to substantially reflect the EUV light. In some embodiments, the collector 36 may further include a grating structure designed to effectively scatter the laser beam directed onto the collector 36. For example, a silicon nitride layer is coated on the collector 36 and is patterned to have a grating pattern.

The laser beam 32 is directed to heat a target material 38, thereby generating high-temperature plasma, which further produces EUV radiation (or EUV light) 40. In the present embodiment, the target material 38 is Tin (Sn). The target material 38 is delivered in droplets. Those target material droplets (such as Tin droplets) are also simply referred to as droplets. The EUV radiation 40 is collected by the collector 36. The collector 36 further reflects and focuses the EUV radiation for the lithography exposing processes.

The radiation source 12 is configured in an enclosed space (referred to as a source vessel). The source vessel is maintained in a vacuum environment since the air absorbs the EUV radiation. In some embodiments, the plasma monitoring module 28 is embedded in the radiation source 12 and is configured to monitor the plasma condition of the radiation source 12.

Figure 3:
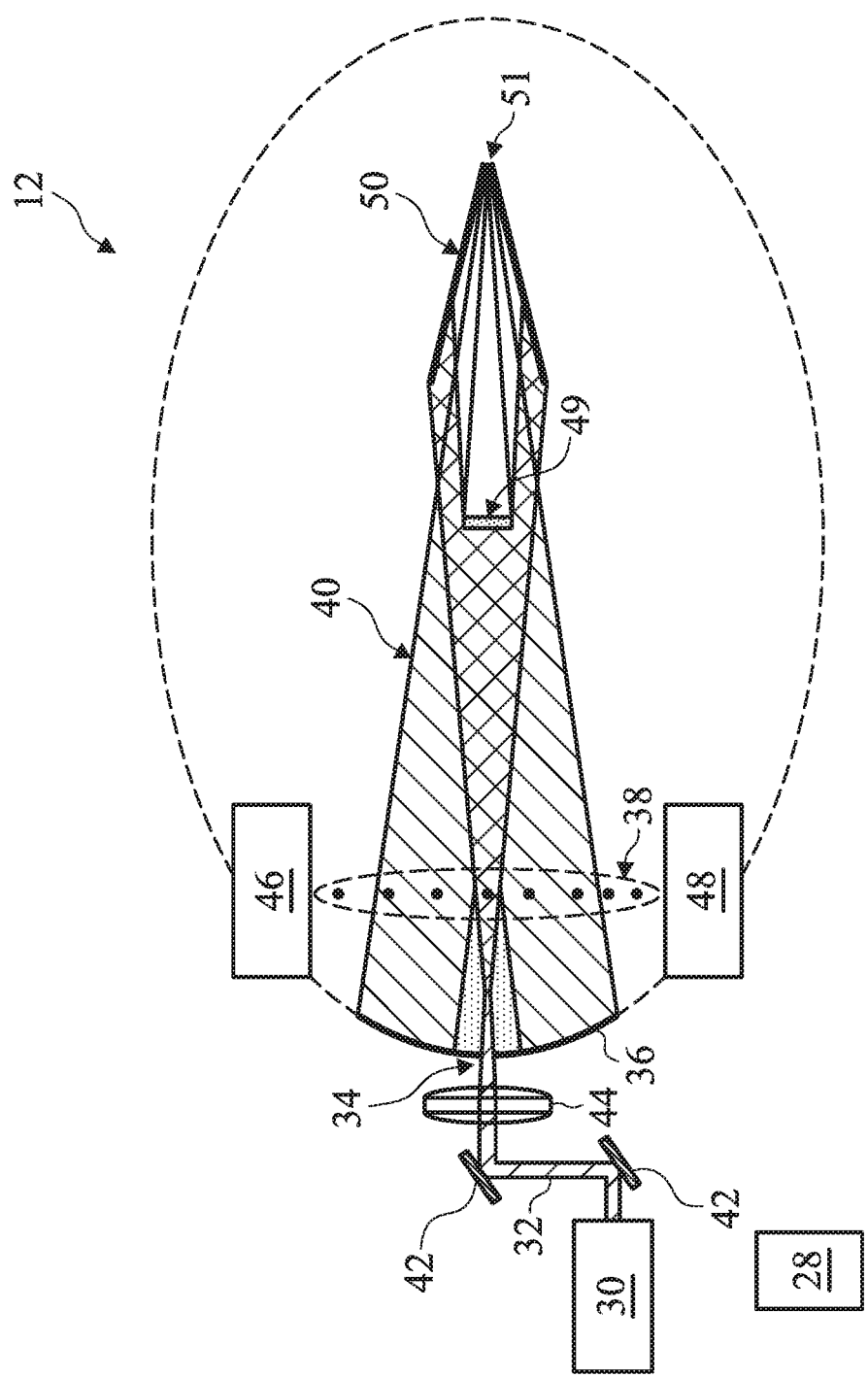
FIG. 3 is a diagrammatic view of the EUV radiation source in the EUV lithography system of FIG. 1, constructed in accordance with some embodiments.

The radiation source 12 may further include more other components integrated together, such as those illustrated in FIG. 3. FIG. 3 is a diagrammatical view of the radiation source 12, constructed in accordance with some embodiments. The radiation source 12 employs a LPP mechanism. The radiation source 12 includes a laser 30, such as pulse $CO_2$ laser to generate laser beam 32. The laser beam 32 is directed by a beam delivery system 42, such as one or more mirrors configured, to a focus lens 44 to focus the laser beam 32. The laser beam 32 is further projected through the output window 34 integrated with a collector 36. The laser beam 32 is focused to the target material 38, such as Tin droplets, thereby generating high-temperature plasma. The Tin droplets are generated by a Tin droplet generator 46. A Tin catcher 48 is further configured to catch the Tin droplets. Thus generated high-temperature plasma further produces EUV radiation 40, which is collected by the collector 36. The collector 36 further reflects and focuses the EUV radiation for the lithography exposing processes. The pulses of the laser 30 and the droplet generating rate of the Tin droplet generator 46 are controlled to be synchronized such that the Tin droplets 38 receive peak powers consistently from the laser pulses of the laser 30. In some examples, the tin droplet generation frequency ranges from 20 kHz to 100 kHz. For example, the laser 30 includes a laser circuit designed to control the generation of the laser pulses. The laser circuit and Tin droplet generator 46 are coupled to synchronize the generation of the laser pulses and the generations of the Tin droplets.

In some embodiments, the radiation source 12 further includes a central obscuration 49 designed and configured to obscure the laser beam 32. The radiation source 12 also includes an intermediate focus (IF)-cap module 50, such as an IF-cap quick-connect module configured to provide intermediate focus 51 to the EUV radiation 40. The IF-cap module 50 may additionally function to obscure the laser beam 32.

The radiation source 12 is configured in an enclosed space (referred to as a source vessel). The source vessel is maintained in a vacuum environment since the air absorbs the EUV radiation. The radiation source 12 may be further integrated with or coupled with other units/modules. For example, a gas supply module is coupled with the radiation source 12, thereby providing hydrogen gas for various protection functions, which include effectively protecting the collector 36 from the contaminations by Tin particles (Tin debris).

Figure 4:
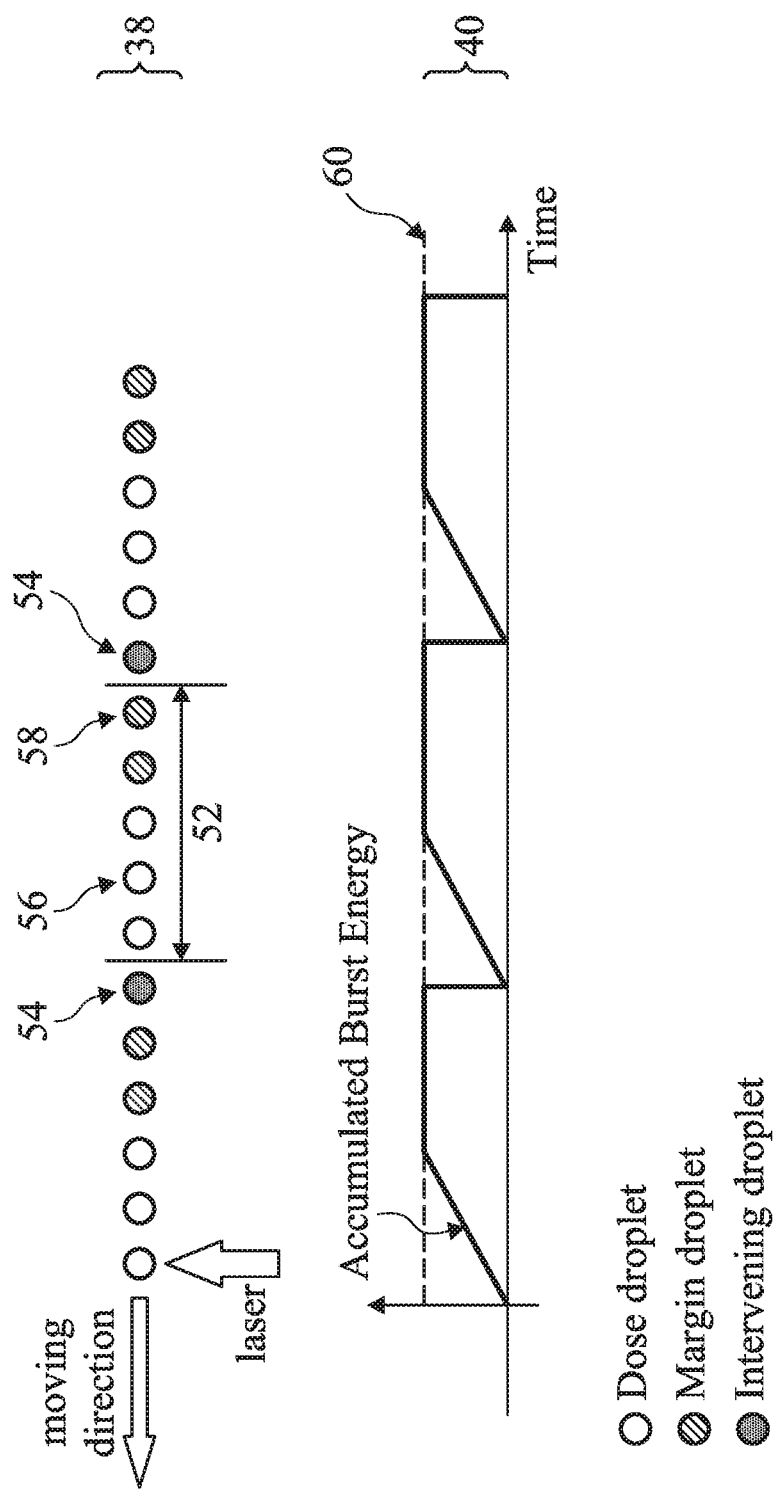
FIG. 4 is a diagrammatic view of the target material droplets used to generate plasma and EUV energy from the plasma in the EUV lithography system of FIG. 1, constructed in accordance with some embodiments.

The target material droplets 38 and EUV radiation 40, and the corresponding mechanism are further illustrated in FIG. 4. The target material droplets are grouped into bursts 52, which are separated by intervening time and intervening droplets 54. In the present embodiments, the intervening droplets 54 will not be excited by the laser beam 30 during the lithography exposing process.

The radiation source 12 provides a series of bursts 52 during a lithography exposing process. Each burst 52 includes a plurality of target material droplets and is configured to provide certain EUV energy (referred to as burst target energy or BTE) during the lithography exposing process. When a semiconductor substrate 22 is exposed using the EUV energy by the lithography system 10 during the lithography system 10, the exposure dosage can be reached when each burst 52 contributes EUV energy to the burst target energy. The target material droplets in each burst are defined to two categories: dose droplets 56 and margin droplets 58. During the lithography exposing process, the dose droplets 56 in each burst are to be excited by the laser to generate plasma and accordingly plasma-generated EUV radiation with EUV energy reaching the burst target energy. The margin droplets 58 in each burst 52 are reserved for dose control and used as a backup to the dose droplets, in order to maintain the EUV energy of the burst to reach the burst target energy. The margin droplets 58 are collectively referred to as dose margin. Due to the instability of the plasma intensity, not all of droplets contribute nominal EUV energy. For example, when the laser generated plasma from one dose droplet has less density, the EUV energy collected from that dose droplet will be less than the normal level. When the EUV energy generated from the dose droplets 56 in the burst 52 cannot reach the burst target energy, the margin droplets 58 or a subset thereof are excited to contribute additional EUV energy such that the total EUV energy from the burst 52 reaches the burst target energy. The number of target material droplets in each burst is Nt. The number of the dose droplets 56 in each burst is designed to be Nd and the number of the margin droplets 56 in each burst is designed to be Nm. There is a relationship among these parameters as Nt=Nd+Nm. Therefore, when the Nt is given, increasing the dose margin will decrease the burst target energy.

The EUV energy 40 is also illustrated in FIG. 4. Each burst needs to provide burst target energy 60 to meet the exposure dosage. This energy is accumulated EUV radiation energy from the dose droplets 56 in that burst. The burst target energy is the EUV energy expected to be collected from the burst in order to reach the exposure dosage. As one example for illustration, assume that a burst has 5 droplets and each droplet generates 1.5 millijoule (mj) EUV energy. If BTE is 4.5 mj, then 3 droplets will accumulate BTE and the rest 2 droplets in the burst may be used as dose margin. Thus, 3 droplets in the burst are used as dose droplets and 2 droplets are reserved as margin droplets. When a droplet is not to be excited, the system 10 provides a mechanism to achieve this. For example, the laser generator of the laser 30 will control the pulses of the laser beam such that the corresponding laser pulse is offset from hitting the droplet.

When the EUV light intensity doesn't reach the setting target-BTE, the margin droplets or a subset thereof are excited to compensate for the EUV energy shortage. In the existing mechanism, the dose margin is determined without consideration of the exposure dosage and EUV radiation stability. If the EUV intensity is below the setting target (which is referred to as a dose error), the margin droplets will be excited to generate EUV light. The number Nm of the margin droplets 58 is large enough to provide enough compensation for EUV shortage in worst case. However, there is a dilemma that how many droplets (Nm) in a burst need to be reserved as margin droplets for dose control. When Nm is smaller, the dose margin may not be enough in the worst case. When Nm is larger and more droplets are used for the dose control, the dose margin is enough to compensate EUV energy shortage. However, the drawback is the number Nd of the dose droplets 56 is limited. In this case, BTE is reduced and the throughput is reduced as well.

In the present embodiment, the target material droplets are moving at a fixed rate; the laser pulses are generated with a fixed frequency; and the wafer scan speed during the lithography exposing process is varied according to the exposure dosage. The existing method only provides generic dose margin (Nm) regardless the exposure dosage (and the wafer scan speed) and plasma instability. However, the dose margin in need is dependent the wafer scan speed during the lithography exposing process. On one side, when the exposure dosage is greater, the scan speed is slower to accumulate higher EUV energy from more bursts to meet the exposure dosage. The throughput is accordingly lower. On another side, the faster the scan speed is, the larger number Nm of margin droplets 58 the system 10 needs to match the plasma instability and EUV energy shortage. To ensure all of products are processed in the respective product specifications, the product with the highest scan speed will limit the minimum dose margin. However, the other products do not need so large dose margin. Accordingly, their throughput will be sacrificed due to excessive dose margin.

This is clear from our following analysis, as illustrated in FIG. 5. Due to the plasma instability, the EUV energy from a burst is not fixed but is predictable in term of probability. Assume that the EUV energy accumulated from a first burst is in a Gaussian distribution, which is described by a Gaussian distribution function 62 in FIG. 5. In the function 62, the variable x is the EUV energy; $B_a(x)$ is the probability of the first burst having the EUV energy of x; $\mu_a$ is the average energy from the first burst; $\sigma_a$ is standard deviation that is associated with the instability of the plasma generated from the first burst; and $\sigma_a^2$ is the variance. Similarly, assume that the EUV energy accumulated from a second burst is in another Gaussian distribution, which is described by a Gaussian distribution function 64. In the function 64, the variable x is the EUV energy; $B_b(x)$ is the probability of the second burst having the EUV energy of x; $\mu_b$ is the average energy from the second burst; $\sigma_b$ is standard deviation that is associated with the instability of the plasma generated from the second burst; and $\sigma_b^2$ is the variance.

The EUV energy accumulated from both the first and second bursts has a collective distribution 66 as a convolution of the first distribution 62 and the second distribution. The collective distribution 66 is another Gaussian distribution where the variable x is the EUV energy from the first and second bursts; $B_{a+b}(x)$ is the probability of the first and second bursts having the EUV energy of x; $\mu_{a+b}$ is the average energy from the first and second bursts; and the corresponding variance of $B_{a+b}(x)$ is $\sigma_a^2+\sigma_b^2$ is standard deviation, which is associated with the plasma instabilities of both the first and second bursts. If the exposure dosage is further accumulated from a third burst having a third distribution, the collective distribution is determined by a convolution from $B_{a+b}(x)$ and the third distribution. Then a fourth burst, a fifth burst, and so on.

Assume that the exposure dosage is accumulated from N bursts and further assume that all N bursts are identical and obey a same Gaussian distribution (same $\mu$ and $\sigma$). In this case, the collective EUV energy distribution function $B_N(x)$ 68 is simplified to a Gaussian distribution with the average energy $N_\mu$ and the standard deviation $\sqrt{N}\ \sigma$. Note that the average energy is increased by a factor N but the standard deviation is increased by a factor $\sqrt{N}$. Accordingly, the dose error is proportional to $1/\sqrt{N}$ as described by a formula 70 in FIG. 5. As the exposure dosage is proportional to the number N, the formula 70 indicates that the exposure dosage is greater, the dose error is less. When the exposure dosage is decreased, the dose error is increased.

Furthermore, our experiments and analysis of the historic data reveal that the plasma instability may vary over time. In other words, the standard deviation $\sigma$ varies over time. For examples, the plasma stability is related to the lifetime of the target material (such as Tin). When the Tin material is at the later lifetime, the Tin droplets have more fluctuation. Accordingly, the plasma generated thereby, and the EUV energy generated by the plasma, is less stable and has more fluctuation. Thus, the dose error may vary from time to time and from wafer to wafer.

From the above analysis, the minimum dose margin depends on the corresponding exposure dosage and further depends on the plasma instability (or generally the instability of the EUV intensity). The disclosed method 76, along with the system 10 implementing the same, provides an effective approach to dynamically determine the dose margin (Nm). In the method 76, the dose margin or more specially the number Nm of the margin droplets is determined per wafer. Specifically, Nm is determined according to the exposure dosage and the plasma instability.

Figures 6, 7:
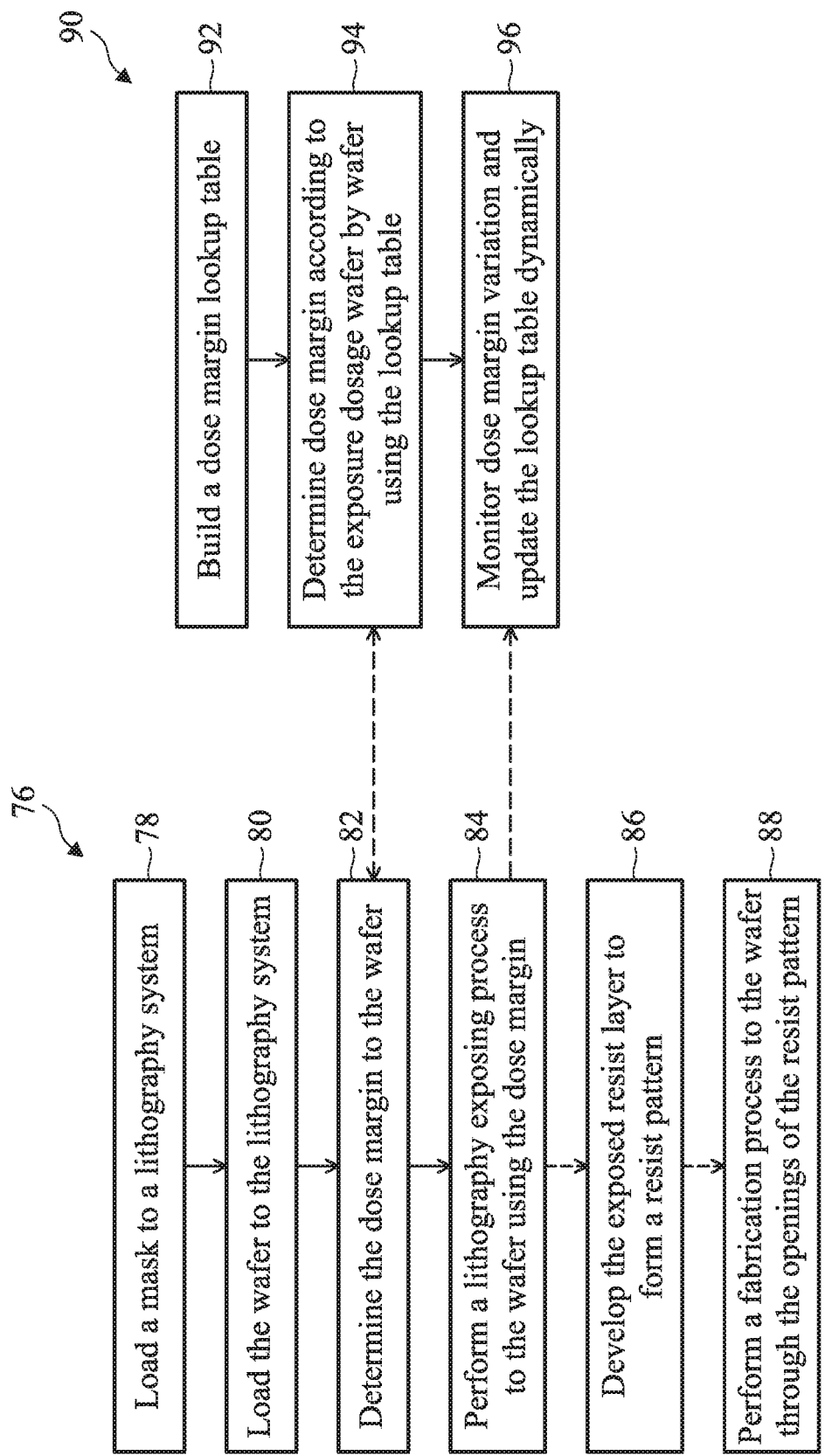
FIG. 6 is a flowchart of a method, constructed in accordance with some embodiments.
FIG. 7 is a flowchart of a method, constructed in accordance with some embodiments.

FIG. 6 illustrates a flowchart of the method 76 for a EUV lithography process implemented by the lithography system 10, constructed in accordance with some embodiments.

The method 76 includes an operation 78 by loading a EUV mask, such as mask 18 to the lithography system 10 that is operable to perform a EUV lithography exposing process. The mask 18 includes an IC pattern to be transferred to a semiconductor substrate, such as the wafer 22. The operation 78 may further include various steps, such as securing the mask 18 on the mask stage 16 and performing an alignment.

The method 76 includes an operation 80 by loading the wafer 22 to the lithography system 10. The wafer 22 is coated with a resist layer. In the present embodiment, the resist layer is sensitive to the EUV radiation from the radiation source 12 of the lithography system 10.

The method 76 includes an operation 82 by determining the dose margin to wafer 22. In the operation 82, the determining of the dose margin is wafer-based and is determined according to the exposure dosage and the plasma instability. In the present case, determining of the dose margin is determining the number Nm of the margin droplets 58 in a burst.

Particularly, Nm is determined according to the exposure dosage. When a product is different, the exposure dosage may be different. As described by the formula 70 in FIG. 5, when the exposure dosage ED is increased, the parameter N is increased proportionally; and the dose error is statistically decreased by the factor $1/\sqrt{N}$. In other words, the dose error $\propto 1/\sqrt{ED}$ and Nm $\propto 1/\sqrt{ED}$.

In the operation 82, determining the parameter Nm is achieved by using manufacturing data, a formula, a lookup table, or a combination thereof. In the first example, the dose error data from the previously processed wafers are collected and used to determine Nm. The previously processed wafers are those wafers that are exposed by the lithography system 10 with the same exposure dosage of the wafer 22.

In some embodiments, the dose margin is determined by a method 90 using a dose margin lookup table. FIG. 7 is a flowchart of the method 90 and FIG. 8 is an exemplary dose margin lookup table 98. The method 90 is described with reference to FIGS. 6-8.

The method 90 includes an operation 92 by building a dose margin lookup table, such as the dose margin lookup table 98. The dose margin lookup table is built according to manufacturing historic data related to the lithography exposing process (by the lithography system 10), such as dose error. The dose margin lookup table 98 relates exposure dosage, dose margin and burst target energy. In the lookup table 98, the first column is the exposure dosage ("PR dose") in a proper unit, such as millijoule (mJ); the second column is the dose margin ("dose margin needed") with percentage; and the second column is the burst target energy ("target energy") in a proper unit, such mJ. In operation 92, the dose margin lookup table is built up according to the exposure dosage, as described above, such that the dose margin is minimized to be enough for EUV energy compensation with maximized burst target energy and maximized throughput of the lithography exposing process. Once the dose margin lookup table is built up, it is maintained by the operation 96 and used to determine the dose margin to each wafer at the operation 94. At the operation 94, the dose margin is determined according to the exposure dosage by looking up the table 98. If the exposure dosage is not in the table but is between two adjacent exposure dosages, it can be determined by a proper technique, such as interpolation. The corresponding burst target energy is provided in the table 98 as well. At the operation 96, the dose margin is monitored for its variation and the table 98 is adjusted accordingly. For example, from the monitored data of the lithography exposing process, if the dose margin is shifted away from the corresponding dose margin (such as 20%), the table 90 is adjusted such that the dose margin is adjusted back to the original value (such as 20%). Thus, the table 98 is dynamically maintained according to the dose margin variation, which is monitored through the manufacturing data, such as by the EUV energy monitor 26.

In some embodiments, the parameter Nm is determined using the formula 70 or $Nm \propto 1/\sqrt{ED}$. In another example, a reference Nm0 is determined to a reference exposure dosage ED0 using the manufacturing data; and Nm to other exposure dosages ED is determined, relative to the reference parameters Nm0 and ED0, using the formula $Nm \propto 1/\sqrt{ED}$ or $Nm = Nm0 \sqrt{ED0/ED}$. Thus, the dose margin is optimized according to the exposure dosage and the throughput is maximized accordingly.

In the present embodiment, Nm is determined additionally according to the plasma instability. Since plasma condition varies from wafer to wafer, the dose margin may be determined to different values even though the exposure dosages of the two wafers are same. In the present embodiment, the plasma condition is monitored and the parameter Nm is adjusted according to the plasma condition, such as through a feed forward mode. In this case, the plasma condition from a first wafer is feed forward to a subsequent wafer such that the dose margin (Nm) of the subsequent wafer back is adjusted according to the plasma condition from the first wafer, since the plasma condition variation is usually continuous. In another embodiment, the parameter Nm is adjusted according to the plasma condition extracted from the same wafer through a feedback mode. For example, when the monitored EUV energy has higher dose error, the dose margin (Nm) associated with the wafer may be adjusted to a high value.

In some embodiments, the plasma condition may be monitored by the plasma monitoring module 28. In some embodiments, the plasma condition may be monitored by the EUV energy monitor 26. In this case, the plasma monitor module 28 and the EUV energy monitor 26 can be combined into one monitoring module. As noted above, the dose error is related to the plasma condition. The EUV energy monitor 26 monitors the EUV energy for the dose error and controls to excite margin droplet(s) 58 according to the dose error. The monitored dose error is not only used to excite the margin droplet(s) 58 for compensating EUV energy shortage but also used as an indicator of the plasma condition to adjust the dose margin (Nm).

It is noted that the dose margin or the parameter Nm is unnecessarily an integer and can be set to any suitable real number. This is possible since a plurality of bursts may be used to expose a same spot to reach the exposure dosage. The dose margin can be unevenly distributed in the plurality of bursts such that the average dose margin matches the parameter Nm. For example, 10 bursts are used to expose the same spot, so 10 times of the burst target energy reaches the exposure dosage. When the parameter Nm is 2.4, then four of the bursts each have 3 dose droplets and the rest 6 bursts each have 2 dose droplets. Therefore, among the 10 bursts, the average number of the dose droplets is 2.4.

In the operation 84, the dose margin is dynamically determined per wafer according to the exposure dosage (associated with wafer scan speed) and the EUV radiation stability (associated with plasma instability). If the wafer scan speed is lower (the exposure dosage is higher), then BTE is increased and the dose margin is reduced to have high throughput. Furthermore, the dose margin is determined additionally accordingly to the plasma stability. The wafers in the same lot may have the same exposure dosage but different plasma stability. Therefore, the dose margins for the wafers in the same lot may be determined to be different such that the margin droplets are enough to compensate the EUV shortage and the number of the dose droplets is maximized.

In the present embodiments, the dose margin (Nm) is collectively determined by both exposure dosage (wafer scan speed) and plasma stability (EUV stability). For example, the initial dose margin is first determined by the exposure dosage. Therefore, the wafers in the same product for the same exposing process may have the same initial dose margin. The initial dose margin is further adjusted according to the plasma stability to provide a final dose margin to a particular wafer. In furtherance of the example, the plasma stability is lower (the plasma instability is higher), the final dose margin is adjusted to be higher. The adjusted amount may be related to the dose errors in the previously processed wafer (or wafers).

In another example, the burst energy is monitored for the plasma stability. The burst energy is defined as the EUV energy accumulated from the dose droplets in a burst. In this case, the plasma stability monitoring module 28 is designed to monitor the burst energy in the previously processed wafer(s). When the burst energy reaches the BTE, no droplet in the dose margin will be used since no energy compensation is needed. The burst energy distribution can be used as an indicator of the plasma stability. In previously processed wafers, when the burst energy has a distribution in a greater range or the distribution range gets greater in a trend, the plasma stability is less. The dose margin is adjusted according to the burst energy distribution.

The method 76 includes an operation 84 by performing a lithography exposing process to the wafer 22 in the lithography system 10. In the operation 84, the laser 30 and the tin droplet generator 46 are synchronized (specifically, laser pulses and Tin droplet generation are synchronized) through a suitable mechanism, such as a control circuit with timer to control and synchronize the both. The synchronized laser 30 excites the dose droplets 56 and generates plasma, thereby generating the EUV radiation. During the operation 84, the generated EUV radiation is illuminated on the mask 18 (by the illuminator 14), and is further projected on the resist layer coated on the wafer 22 (by the POB 20), thereby forming a latent image on the resist layer. In the present embodiment, the lithography exposing process is implemented in a scan mode.

Particularly, during the lithography exposing process, the dose droplets 56 are excited. The EUV energy is also monitored, such as by the EUV energy monitor 26. When a dose error occurs (the accumulated burst energy is less than BTE), the margin droplet(s) 58 in the dose margin or a fraction thereof is (are) excited by the laser 30 to provide additional EUV energy in compensating the EUV energy shortage, in order to reach BTE (thereby reaching the exposure dosage). Accordingly, the laser pulse and the tin droplet generation are synchronized to excite the corresponding margin droplet.

In some embodiments, a pre-compensation is used to provide additional dose margin without sacrificing the throughput. In this case, any unused margin droplets in one burst are used in advance to compensate the potential EUV energy shortage. In the existing method, if a margin droplet in a burst is not used to compensate the dose error of that burst, that margin droplet will never be used and will be wasted. In the disclosed method, a margin droplet in one burst is excited and used to a subsequent burst. Thus, without increasing Nm (the budge to the dose margin), the dose margin is increased. The operation "pre-compensation" and other related concepts are further described at later stage.

The method 76 may include other operations to complete the lithography exposing process. For example, the method 76 may include an operation 86 by developing the exposed resist layer to form a resist pattern having a plurality of openings defined thereon. In one example, the resist layer is positive tone; the exposed portion of the resist layer is removed by the developing solution. In another example, the resist layer is negative tone; the exposed portion of the resist layer remains; and the non-exposed portion is removed by the developing solution. In yet another example, the resist layer is negative tone and the developing solution is negative tone; the exposed portion of the resist layer is removed by the developing solution. In yet another example, the resist layer is positive tone and the developing solution is negative tone; the exposed portion of the resist layer remains; and the non-exposed portion is removed by the developing solution.

Particularly, after the lithography exposing process at the operation 84, the wafer 22 is transferred out of the lithography system 10 to a developing unit to perform the operation 86. The method 76 may further include other operations, such as various baking steps. As one example, the method 76 may include a post-exposure baking (PEB) step between the operations 84 and 86.

The method 76 may further include other operations, such as an operation 88 to perform a fabrication process to the wafer through the openings of the resist pattern. In one example, the fabrication process includes applying an etch process to the semiconductor substrate 22 or a material layer on the semiconductor substrate using the resist pattern as an etch mask. In another example, the fabrication process includes performing an ion implantation process to the semiconductor substrate 22 using the resist pattern as an implantation mask. After the operation 88, the resist layer may be removed by wet stripping or plasma ashing.

Thus, the dose margin is dynamically determined per wafer to be greater enough to compensate the EUV energy shortage but is less enough without excessive sacrifice to BTE and the throughput. Other alternatives or embodiments may present without departure from the spirit and scope of the present disclosure. In one example, other type of EUV mask, such as a phase shift EUV mask, may be used to further enhance the resolution of the lithography exposing process. In another example, the target material may use other suitable material to generate a high-temperature plasma.

Figure 9:
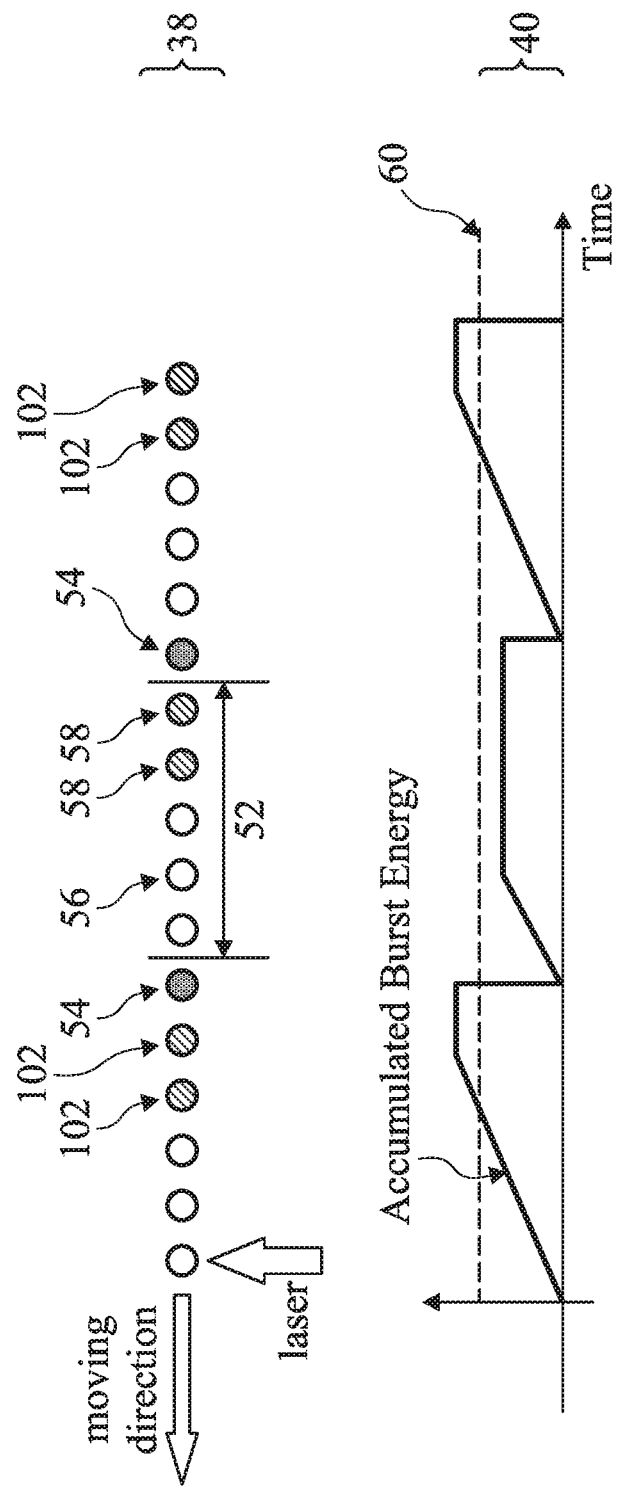
FIG. 9 is a diagrammatic view of the droplets used to generate plasma and EUV energy from the plasma, constructed in accordance with some embodiments.

As noted above, without increasing the budget of the dose margin, the compensation of, the EUV energy shortage in one burst during the lithography exposing process is compensated by the margin droplets from an adjacent burst. FIG. 9 illustrates a pre-compensation method in a schematic view, constructed in accordance with some embodiments. The pre-compensation is an operation to excite the dose margin in the previous burst to compensate the energy shortage in the subsequent burst. In exemplary one illustrated in FIG. 9, the target material droplets 38 have three bursts 52 (referred to as first, second and third from left to right). Each burst has five droplets, two of the five droplets are margin droplets and other three droplets are used as dose droplets. Those margin droplets excited for pre-compensation are labeled as 102 in FIG. 9. In the first burst (on the far left in FIG. 9), the accumulated burst energy from the dose droplets (the first three droplets in the burst) reaches the BTE 60. The droplets in the dose margin may not be used since there is no dose error in the current burst. However, in the pre-compensation method, the droplets 102 (or a subset thereof) in the dose margin are excited so the burst energy in the current burst exceeds the BTE 60. The extra energy from the droplets 102 are referred to as pre-compensation and are used to compensate the potential energy shortage in the subsequent burst. When the dose error occurs in the second burst (middle burst), the extra energy from the first burst is used to compensate the energy shortage in the second burst. Since both bursts are used to expose the same spot. Total exposure energy to that spot can thus be maintained to reach to the exposure dosage. Similarly, the droplets 102 in the third burst are also excited to generate extra energy for pre-compensation. By using the pre-compensation, the system 10 gains additional margin to compensate the energy shortage. The probability of the occurrence of dose error is reduced. Thus, Nm may be further decreased, thereby enhancing the throughput.

Figure 10:
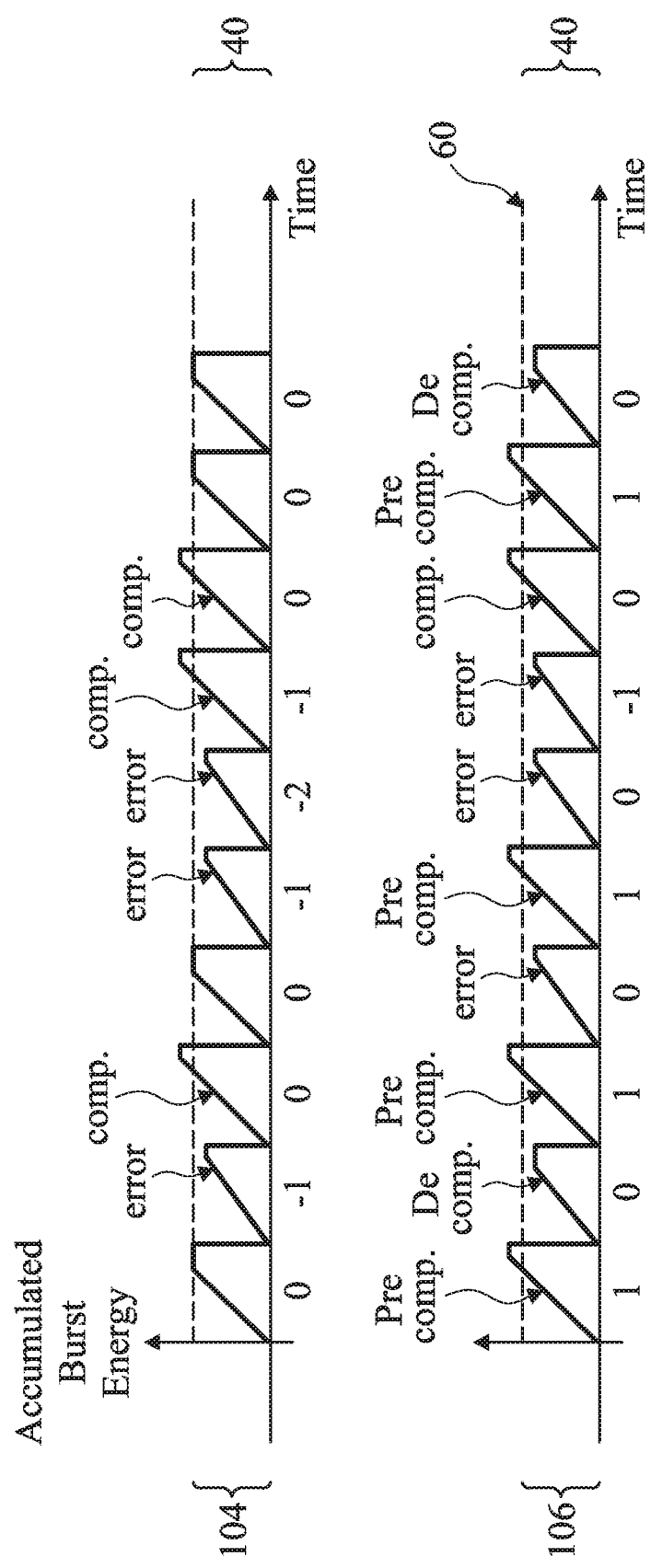
FIG. 10 is a diagrammatic view of the droplets used to generate plasma and EUV energy from the plasma, constructed in accordance with some embodiments.

FIG. 10 further illustrates the method for pre-compensation, constructed in accordance with some embodiments. The EUV energy 40 for a plurality of burst is illustrated relative to the BTE 60. In one method, a plurality of bursts 104 is used in a lithography exposing process. When a dose error occurs in one of the plurality of bursts 104, the margin droplets in that burst are used to compensate the EUV energy shortage. If the dose error is greater than the EUV energy from the margin droplets in the burst, the dose error cannot be completely compensated.

In another method, pre-compensation is implemented to a plurality of bursts 106 during a lithography exposing process. There are two adjacent bursts of the target material droplets. For better description, one burst is referred to as pre-burst and another burst right after the pre-burst is referred to as post-burst. When a dose error occurs in a post-burst, the margin droplets in the pre-burst are used to compensate the energy shortage associated with the dose error of the post-burst. Alternatively, the margin droplets in a pre-burst and the margin droplets in the post-burst are collectively used to compensate the energy shortage. To maintain proper exposure dosage, a de-compensation is used with pre-compensation. When the margin droplets (or a subset) of a pre-burst are used to compensate the energy shortage of the post-burst, the post-burst may not have the dose error. In this case, the post-burst may only use a subset of the dose droplets to offset the excessive energy generated in the pre-burst by pre-compensation, such that the overall energy is balanced to meet the exposure dosage.

By implementing pre-compensation, the margin droplets are carried over to subsequent burst. In some examples, pre-composition and decomposition may be used in pairs if the post-burst has no dose error. In some examples, post-composition may be implemented to compensate the EUV energy shortage of a pre-burst by the margin droplets in the post-burst. In yet other examples, the pre-compensation or post-compensation may be applied to a burst that is not a direct neighbor burst.

Various examples are illustrated and explained in the bursts 106 from left to right during the lithography exposing process. The first burst has pre-compensation; the second burst has a de-compensation since no dose error; the third burst has a pre-compensation; the fourth burst does not implement pre-compensation or de-compensation since the dose error is compensated by the pre-compensation of the third burst; the fifth burst has a pre-compensation; the sixth burst does not implement pre-compensation or de-compensation since the dose error is compensated by the pre-compensation of the fifth burst; the seventh burst has a dose error not completely compensated by the margin droplets in the burst but post-compensated by the following burst; the eighth burst has a post-compensation; The ninth burst has pre-compensation; and the tenth burst has a de-compensation since no dose error. In FIG. 10, the parameters "1", "0" and "−1" below the bursts indicate accumulated dose error "over energy", "within the range", and "under energy", respectively. The method 76 may implement at least a subset of pre-compensation, de-compensation and post-compensation in the lithography exposing process of the operation 84.

Figure 11:
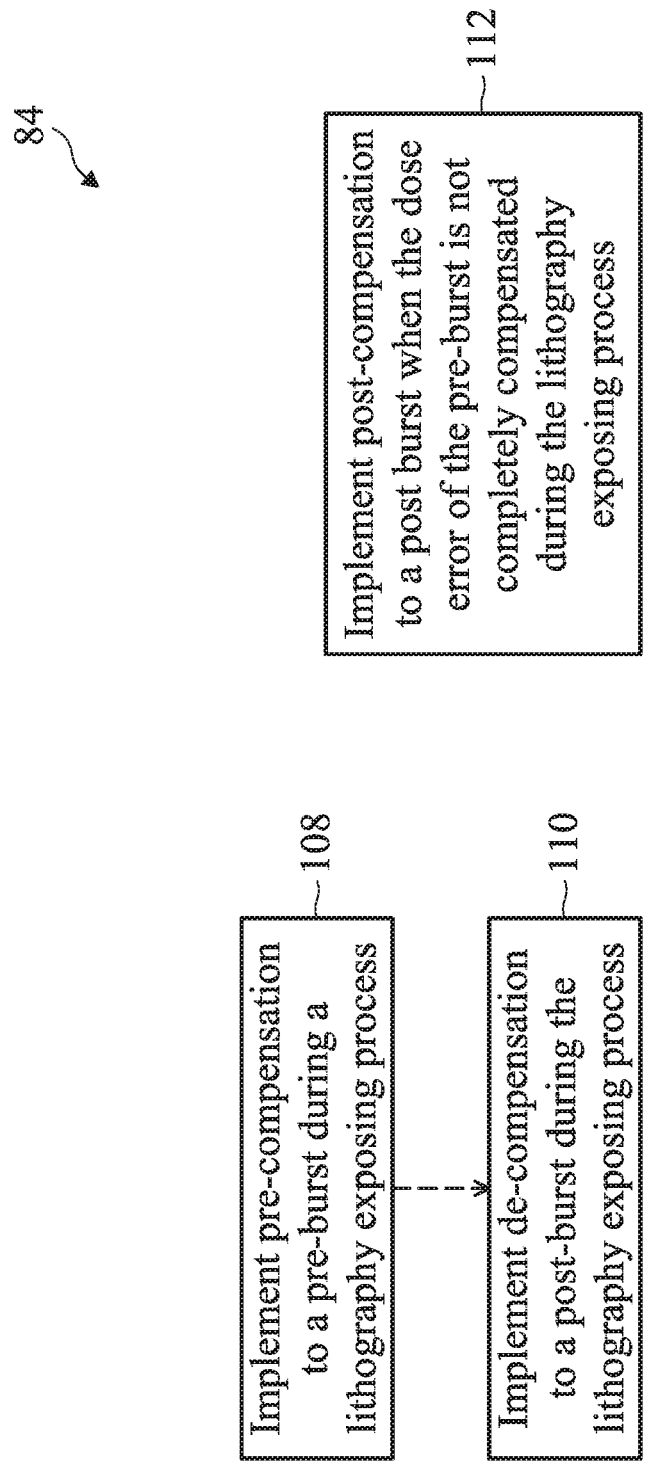
FIG. 11 is a flowchart of a method, constructed in accordance with some embodiments.

The pre-compensation and other actions are further described with reference to FIG. 11 as a flowchart to the operation 84 of the method 76. The operation 84 includes a lithography exposing process. During the lithography exposing process, the operation 84 performs a pre-compensation 108 to a pre-burst to compensate potential EUV energy shortage in the post-burst. When there is no dose error in the post-burst, the operation 84 further performs a de-compensation 110 to the post-burst for balancing the EUV energy. The operation 110 may be skipped if the dose error does occur in the post-burst. When the dose error occurs in a re-burst and is not completely compensated by the margin droplets in the pre-burst, the operation 84 may perform a post-compensation 112 to the post-burst to compensate the EUV energy shortage from the pre-burst. During the lithography exposing process, pre-compensation 108, de-compensation 110 and post-compensation 112 may be performed as many as needed through the plurality of bursts 106. The pre-burst and post-burst refer to any two adjacent bursts in the plurality of bursts 106 during the lithography exposing process. Pre-compensation 108, de-compensation 110, and post-compensation 112 are collectively referred to as inter-compensation. In other embodiments, the inter-compensations may be implemented to other lithography process absence of the operation 82.

The method 76 implementing a lithography exposing process and the lithography system 10 are provided in accordance with some embodiments. In the method 76, the dose margin (Nm) is determined dynamically per wafer according to the exposure dosage and the plasma condition. In some embodiments, inter-compensation operations (such as pre-compensation 108, de-compensation 110, and post-compensation 112) are implemented to compensate the EUV energy shortage. Some embodiments of the present disclosure offer advantages over existing art, though it is understood that other embodiments may offer different advantages, not all advantages are necessarily discussed herein, and that no particular advantage is required for all embodiments. By utilizing the disclosed method, the dose margin is dynamically determined per wafer to be greater enough to compensate the EUV energy shortage but is less enough without excessive sacrifice to BTE and the throughput. Thus, the throughput of the lithography exposing process is enhanced. Since the dose margin is adjusted according to the plasma condition, the stability of the lithography system is optimized. By implementing the inter-compensation, the margin droplets are shared between the adjacent bursts so that the number Nm of the margin droplets can be further reduced without sacrifice the overall dose margin. Accordingly, the throughput of the lithography exposing process is further increased.

Thus, the present disclosure provides an extreme ultraviolet (EUV) lithography process in accordance with some embodiments. The process includes loading a wafer to an EUV lithography system having an EUV source; determining a dose margin according to an exposure dosage and a plasma condition of the EUV source; and performing a lithography exposing process to the wafer by EUV light from the EUV source, using the exposure dosage and the dose margin.

The present disclosure provides an EUV lithography process in accordance with some other embodiments. The process includes loading a wafer to an EUV lithography system having an EUV source; loading an EUV photomask to the lithography system; and performing a lithography exposing process to the wafer, wherein the performing of the lithography exposing process includes performing an inter-compensation operation.

The present disclosure also provides an extreme ultraviolet (EUV) lithography system in accordance with some embodiments. The system includes an EUV source to generate EUV radiation, wherein the EUV source includes a laser, a target material droplet generator; a mask stage configured to secure an EUV mask; a wafer stage configured to secure a semiconductor wafer; an optical module designed to direct the EUV radiation from the EUV source to image an IC pattern defined on the EUV mask to the semiconductor wafer in a lithography exposing process using a dose margin; and a plasma stability monitoring module to monitor a plasma condition of the EUV source, wherein the plasma condition is used to adjust the dose margin in the lithography exposing process applied to the semiconductor wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography method comprising:
    exposing a resist layer disposed over a wafer to radiation, wherein the radiation is generated by:
        generating a first burst of first target material droplets, wherein the first target material droplets includes first dose droplets and first margin droplets, wherein the first margin droplets are reserved for compensating dose error;
        generating a second burst of second target material droplets after the first burst of first target material droplets, wherein the second target material droplets includes second dose droplets and second margin droplets, wherein the second margin droplets are reserved for compensating dose error;
        exciting the first dose droplets;
        exciting at least one of the first margin droplets to compensate for any burst target energy shortage of the second dose droplets; and
        exciting the second dose droplets.

2. The lithography method of claim 1, wherein:
    an accumulated burst energy from the exciting of the first dose droplets and the at least one of the first margin droplets is greater than a burst target energy; and
    an accumulated burst energy from the exciting of the second dose droplets is less than the burst target energy.

3. The lithography method of claim 1, further comprising, when the second burst does not have a dose error, not exciting at least one of the second dose droplets.

4. The lithography method of claim 1, wherein:
    the first target material droplets and the second target material droplets are generated at a fixed rate during the exposing;
    laser pulses for exciting the first dose droplets, the second dose droplets, and the at least one of the first margin droplets are generated at a fixed frequency; and
    a wafer scan speed during the exposing varies with an exposure dosage.

5. The lithography method of claim 4, further comprising determining a number of the first margin droplets and a number of the second margin droplets based on the wafer scan speed.

6. The lithography method of claim 1, wherein:
    the generating the first burst of the first target material droplets and the generating the second burst of the second target material droplets includes generating tin droplets; and
    the exciting includes directing a laser beam at the first dose droplets, the second dose droplets, and the at least one of the first margin droplets.

7. The lithography method of claim 6, further comprising synchronizing the generating of the tin droplets and generating of laser pulses from the laser beam.

8. The lithography method of claim 1, wherein radiation generated from the exciting of the first dose droplets, the exciting of the at least one of the first margin droplets, and the exciting of the second dose droplets exposes a same spot of the resist layer.

9. The lithography method of claim 1, further comprising:
    developing the exposed resist layer, thereby forming a patterned resist layer; and
    performing a fabrication process on the wafer using the patterned resist layer as a mask.

10. A lithography method comprising:
    exposing a first resist layer disposed over a first wafer to radiation, wherein the radiation is generated by using a laser beam to excite first dose droplets and first margin droplets, wherein the first margin droplets are reserved for dose control when an energy of the radiation generated from the first dose droplets cannot reach a first target energy for meeting a first exposure dosage for the first resist layer;
    exposing a second resist layer disposed over a second wafer to radiation, wherein the radiation is generated by using the laser beam to excite second dose droplets and second margin droplets, wherein the second margin droplets are reserved for dose control when an energy of the radiation generated from the dose droplets cannot reach a second target energy for meeting a second exposure dosage for the second resist layer, wherein the second exposure dosage is different than the first exposure dosage; and
    wherein a first wafer scan speed during the exposing of the first resist layer depends on the first exposure dosage, a second wafer scan speed during the exposing of the second resist layer depends on the second exposure dosage, a number of the first margin droplets is based on the first wafer scan speed, and a number of the second margin droplets is based on the second wafer scan speed.

11. The lithography method of claim 10, wherein the first dose droplets, the first margin droplets, the second dose droplets, and the second margin droplets are target material droplets, the lithography method further comprising synchronizing generating of the target material droplets and generating laser pulses from the laser beam during the exposing.

12. The lithography method of claim 11, wherein the target material droplets move at a fixed rate and the laser pulses are generated at a fixed frequency.

13. The lithography method of claim 10, wherein:
    the first exposure dosage is greater than the second exposure dosage;
    the first wafer scan speed is less than the second wafer scan speed; and
    the number of the first margin droplets is greater than the number of the second margin droplets.

14. The lithography method of claim 10, wherein the first wafer corresponds with a first integrated circuit product and the second wafer corresponds with a second integrated circuit product that is different than the first integrated circuit product.

15. The lithography method of claim 10, wherein:
    the radiation is extreme ultraviolet radiation generated from a laser-produced plasma;
    the using the laser beam to excite the first dose droplets and the first margin droplets generates a first plasma that produces first extreme ultraviolet radiation; and
    the using the laser beam to excite the second dose droplets and the second margin droplets generates a second plasma that produces second extreme ultraviolet radiation.

16. The lithography method of claim 15, wherein:

the first dose droplets, the first margin droplets, the second dose droplets, and the second margin droplets are target material droplets;

the number of the first margin droplets and the number of the second margin droplets is further based on a stability of the laser-produced plasma; and the stability depends on a droplet size, variation of an ionized rate of the target material droplets, variation of concentration of the laser-produced plasma, or a combination thereof.

17. The lithography method of claim 10, further comprising:

developing the exposed first resist layer and the exposed second resist layer, thereby forming a first patterned resist layer and a second patterned resist layer; and using the first patterned resist layer as a mask to process the first wafer and the second patterned resist layer as a mask to process the second wafer.

18. A lithography apparatus comprising:

a target material droplet generator configured to generate a plurality of target material droplets, wherein the plurality of target material droplets include dose droplets and margin droplets reserved for dose control; and a plasma generator configured to excite the dose droplets to generate radiation for exposing a wafer, wherein at least one of the margin droplets is also excited when an energy of the radiation generated from the dose droplets cannot reach a target energy, and further wherein a number of the margin droplets is based on a wafer scan speed during the exposing.

19. The lithography apparatus of claim 18, further comprising a monitoring module configured to adjust a number of the margin droplets on a per wafer basis.

20. The lithography apparatus of claim 18, further comprising a dose margin lookup table that correlates exposure dosage, target energy, and required dose margin, wherein the dose margin is adjusted based on the dose margin lookup table when a dose error indicates that an accumulated energy is less than a desired target energy.

* * * * *